(12) United States Patent
Kang et al.

(10) Patent No.: US 11,639,309 B2
(45) Date of Patent: May 2, 2023

(54) GLASS PRODUCT AND DISPLAY DEVICE INCLUDING THE SAME

(71) Applicant: Samsung Display Co., LTD., Yongin-si (KR)

(72) Inventors: Byung Hoon Kang, Hwaseong-si (KR); Seung Kim, Seongnam-si (KR); Gyu In Shim, Yongin-si (KR); Hoi Kwan Lee, Suwon-si (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 469 days.

(21) Appl. No.: 16/931,142

(22) Filed: Jul. 16, 2020

(65) Prior Publication Data

US 2021/0179489 A1 Jun. 17, 2021

(30) Foreign Application Priority Data

Dec. 16, 2019 (KR) .................. 10-2019-0167703

(51) Int. Cl.
| | |
|---|---|
| *C03C 21/00* | (2006.01) |
| *B32B 7/12* | (2006.01) |
| *B32B 17/06* | (2006.01) |
| *H01L 33/48* | (2010.01) |
| *H01L 27/15* | (2006.01) |

(52) U.S. Cl.
CPC .............. *C03C 21/002* (2013.01); *B32B 7/12* (2013.01); *B32B 17/06* (2013.01); *H01L 27/156* (2013.01); *H01L 33/483* (2013.01); *B32B 2307/412* (2013.01); *B32B 2315/08* (2013.01); *B32B 2457/20* (2013.01)

(58) Field of Classification Search
CPC .................................................... B32B 2315/08
See application file for complete search history.

(56) References Cited

U.S. PATENT DOCUMENTS

| | | | |
|---|---|---|---|
| 8,075,999 B2 | 12/2011 | Barefoot et al. |
| 9,487,434 B2 | 11/2016 | Amin et al. |
| 9,567,254 B2 | 2/2017 | Amin et al. |
| 10,118,858 B2 | 11/2018 | Amin et al. |

FOREIGN PATENT DOCUMENTS

KR    1020190020028 A    2/2019

*Primary Examiner* — Ian A Rummel
(74) *Attorney, Agent, or Firm* — Cantor Colburn LLP

(57) ABSTRACT

A glass product includes: a first compressive region at a first surface; a second compressive region at a second surface; and a tensile region between the first and second compression regions. A stress profile of the first compressive region includes a first trend line between the first surface and a first transition point, a second trend line between the first transition point and a second transition point, and a third trend line between the second transition point and a point at a first compression depth from the first surface. A depth from the first surface to the first transition point is 10 µm or less, a stress at the first transition point is 200 MPa or greater, a depth from the first surface to the second transition point is 50 µm to 80 µm, and a stress at the second transition point is 40 MPa to 100 MPa.

20 Claims, 10 Drawing Sheets

GLASS PRODUCT AND DISPLAY DEVICE INCLUDING THE SAME

This application claims priority to Korean Patent Application No. 10-2019-0167703, filed on Dec. 16, 2019, and all the benefits accruing therefrom under 35 U.S.C. § 119, the content of which in its entirety is herein incorporated by reference.

BACKGROUND

1. Field

Embodiments of the invention relates to a glass product and a display device including the glass product.

2. Description of the Related Art

Glass products are widely used in building materials and electronic devices with display devices. For example, glass products are used in the substrates and the cover windows of flat panel display devices such as liquid crystal display ("LCD") devices, organic light-emitting diode ("OLED") display devices, electrophoretic display devices, and the like.

As portable electronic devices such as smartphones or tablet personal computers ("PC"s) have increasingly become widespread, glass products used in such portable electronic devices have often been exposed to external impact. There is an increasing demand for glass products capable of maintaining thinness for portability and properly enduring external impact.

SUMMARY

Attempts have been made to improve the strength of glass products through thermal or chemical strengthening, but a more precise control of the stress profile of glass products is desired to better meet customers' needs.

An embodiment of the invention provides a glass product having an improved strength at a predetermined depth.

Another embodiment of the invention provides a display device including a glass product having an improved strength at a predetermined depth.

According to an embodiment, a glass product includes a first surface; a second surface opposite to the first surface; a first compressive region extending from the first surface to a point at a first compression depth from the first surface; a second compressive region extending from the second surface to a point at a second compression depth from the second surface; and a tensile region disposed between the first and second compression regions. In such an embodiment, a stress profile of the first compressive region includes a first trend line between the first surface and a first transition point, a second trend line between the first transition point and a second transition point, and a third trend line between the second transition point and the point at the first compression depth, a depth from the first surface to the first transition point is about 10 micrometers ($\mu$m) or less, a stress at the first transition point is about 200 megapascals (MPa) or greater, a depth from the first surface to the second transition point is in a range of about 50 $\mu$m to about 80 $\mu$m, and a stress at the second transition point is in a range of about 40 MPa to about 100 MPa.

In an embodiment, the first, second, and third trend lines may have a first average slope, a second average slope, and a third average slope, respectively, and the first, second, and third average slopes may be negative.

In an embodiment, an absolute value of the first average slope may be greater than an absolute value of the second average slope and an absolute value of the third average slope.

In an embodiment, the absolute value of the second average slope may be greater than the absolute value of the third average slope.

In an embodiment, a tangent at the first transition point may have a first transition point slope, and the first transition point slope may be negative.

In an embodiment, an absolute value of the first transition point slope may be in a range of the absolute value of the first average slope and the absolute value of the second average slope.

In an embodiment, a tangent at the second transition point may have a second transition point slope, and the second transition point slope may be negative.

In an embodiment, an absolute value of the second transition point slope may be in a range of the absolute value of the second average slope and the absolute value of the third average slope.

In an embodiment, the first, second, and third trend lines may have first tangential slopes, second tangential slopes, and third tangential slopes, respectively, and the first tangential slopes, the second tangential slopes, and the third tangential slopes may be negative.

In an embodiment, all of the first tangential slopes of the first trend line may be negative, all of the second tangential slopes of the second trend line may be negative, and all of the third tangential slopes of the third trend line may be negative.

In an embodiment, a compressive stress at the first surface may be in a range of about 700 MPa to about 950 MPa, and the first compression depth may be in a range of about 125 $\mu$m to about 135 $\mu$m.

In an embodiment, the glass product may include lithium aluminosilicate.

In an embodiment, t stress profile of the second compressive region may be symmetrical with the stress profile of the first compressive region.

According to another embodiment, a glass product includes a first surface; a second surface opposite to the first surface; a first compressive region extending from the first surface to a point at a first compression depth from the first surface; a second compressive region extending from the second surface to a point at a second compression depth from the second surface; and a tensile region disposed between the first and second compression regions. In such an embodiment, a stress profile of the first compressive region includes a first trend line between the first surface and the first transition point, a second trend line between the first and second transition points, and a third trend line between the second transition point and the first compression depth, the first, second, and third trend lines correspond to first, second, and third functions, respectively, and the first, second, and third functions are respectively defined as follows: $y=a_1(x-p1)^2+y=a_2(x-p2)^2+q2$; and $y=a_3(x-p3)^2+q3$, where $a_1$, $a_2$, and $a_3$ are coefficients and have positive values, p1, p2, and p3 respectively denote x-axis coordinates of vertexes of the first, second, and third functions, and q1, q2, and q3 respectively denote y-axis coordinates of the vertexes of the first, second, and third functions.

In an embodiment, the coefficient $a_1$ of the first function may be greater than the coefficients $a_2$ and $a_3$ of the second and third functions, and the coefficient $a_2$ of the second function may be greater than the coefficient $a_3$ of the third function.

In an embodiment, the x-axis coordinate p1 of the vertex of the first function may be in a range of about 5 μm to about 50 μm, the x-axis coordinate p2 of the vertex of the second function may be in a range of about 50 μm to about 150 μm, the x-axis coordinate p3 of the vertex of the third function may be in a range of about 160 μm to about 250 μm, the y-axis coordinate q1 of the vertex of the first function may be in a range of about 100 MPa to about 300 MPa, the y-axis coordinate q2 of the vertex of the second function may be in a range of about 5 MPa to about 80 MPa, and the x-axis coordinate q3 of the vertex of the third function may be in a range of about −60 MPa to about 0 MPa.

In an embodiment, a depth from the first surface to the first transition point may be about 10 μm or less, a stress at the first transition point may be about 200 MPa or greater, a depth from the first surface to the second transition point may be in a range of about 50 μm to about 80 μm, and a stress at the second transition point may be in a range of about 40 MPa to about 100 MPa.

In an embodiment, a stress profile of the second compressive region may be symmetrical with the stress profile of the first compressive region.

According to still another embodiment, a display device includes a display panel including a plurality of pixels; a cover window disposed above the display panel; and an optically transparent bonding layer disposed between the display panel and the cover window. In such an embodiment, the cover window includes a first surface, a second surface opposite to the first surface, a first compressive region extending from the first surface to a point at a first compression depth from the first surface, a second compressive region extending from the second surface to a point at a second compression depth from the second surface; and a tensile region disposed between the first and second compression regions. In such an embodiment, a stress profile of the first compressive region includes a first trend line between the first surface and a first transition point, a second trend line between the first transition point and a second transition point, and a third trend line between the second transition point and the point at the first compression depth, a depth from the first surface to the first transition point is about 10 or less, stress at the first transition point is about 200 MPa or greater, a depth from the first surface to the second transition point is in a range of about 50 μm to about 80 μm, a stress at the second transition point is in a range of about 40 MPa to about 100 MPa, and a stress at a depth of about 30 μm from the first surface is about 100 MPa or greater.

In an embodiment, the first, second, and third trend lines may have a first average slope, a second average slope, and a third average slope, respectively, the first, second, and third average slopes may be negative, and an absolute value of the first average slope may be greater than an absolute value of the second average slope and an absolute value of the third average slope.

According to other embodiments of the disclosure, crack resistance of a glass product may be improved by enhancing the stress of portions of the glass product that correspond to the depth of daily cracks.

BRIEF DESCRIPTION OF THE DRAWINGS

The above and other embodiments and features of the disclosure will become more apparent by describing in detail embodiments thereof with reference to the accompanying drawings, in which.

DETAILED DESCRIPTION

Figure 1:
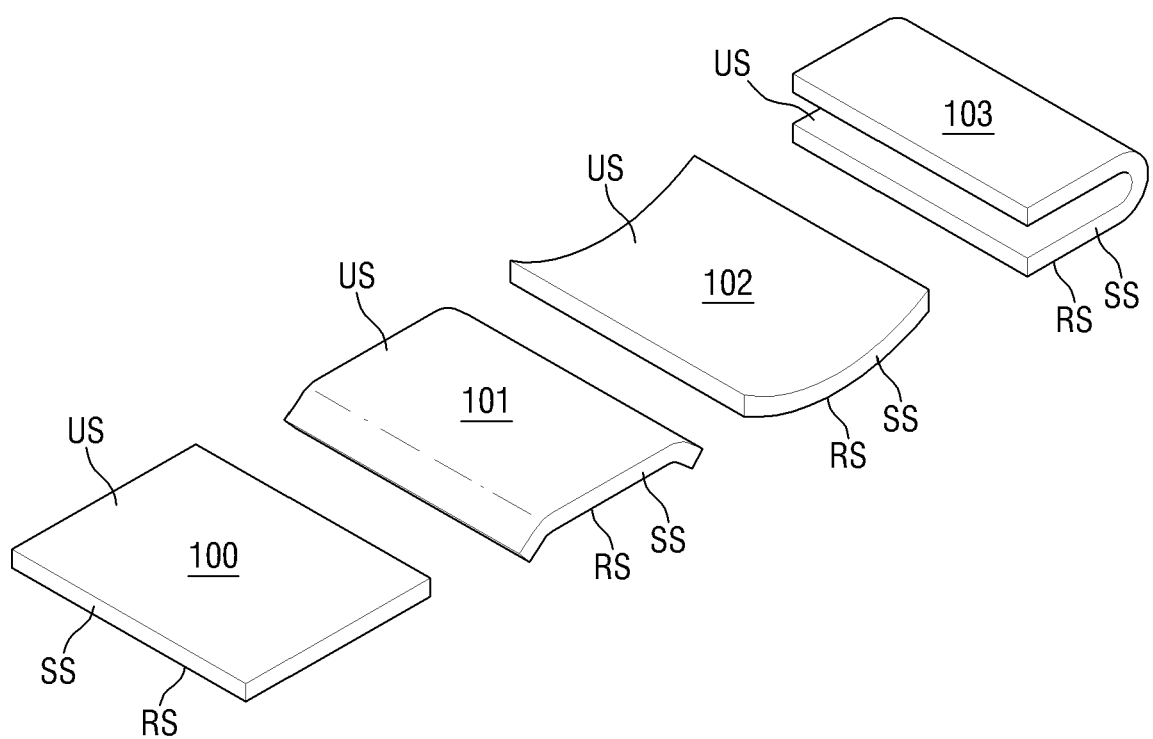
FIG. 1 is a perspective view illustrating a glass product according to various embodiments of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on", "coupled to" or "connected to" to another element, it can be directly coupled or connected to the other element or intervening elements may be present therebetween. In contrast, it should be understood that when an element is referred to as being related to another element such as being "directly on", "coupled directly to" or "connected directly to" to another element, there are no intervening elements present. Other expressions that explain the relationship between elements, such as "between," "directly between," "adjacent to," or "directly adjacent to," should be construed in the same way.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

The term "glass product", as used herein, refers to an object formed of, or containing, at least in part, glass.

Hereinafter, embodiments of the invention will be described in detail with reference to the accompanying drawings.

FIG. 1 is a perspective view illustrating a glass product according to various embodiments of the disclosure.

Glass is used not only in tablet personal computers ("PC"s), laptop computers, smartphones, electronic book readers, televisions ("TV"s), or PC monitors, but also in electronic devices (such as refrigerators or washing machines) including display devices. Glass may be used in cover windows, display or touch panels, or optical members such as light guide plates. Glass may also be used in cover glasses for automobile instrument panels, cover glasses for solar cells, building interior materials, and the windows of buildings or houses.

Some glass is desired to have a high strength. In a display device, for example, glass for use in a window is desired to be sufficiently thin to achieve high transmittance and light weight, and to be strong enough not to be easily broken by external impact. Strengthened glass may be produced by chemical strengthening or thermal strengthening. Embodiments of strengthened glass having various shapes are illustrated in FIG. 1.

Referring to FIG. 1, in an embodiment, a glass product 100 may be in the shape of a flat sheet or a flat plate. In an alternative embodiment, the glass product 101, 102, or 103 may have a three-dimensional (3D) shape including curved parts. In an embodiment, as shown in FIG. 1, the glass product 101 may include a flat portion with curved edges, the glass product 102 may be generally curved, or the glass product 103 may be folded, for example.

In an embodiment, the glass product 100 through 103 may have a rectangular shape in a plan view, but the disclosure is not limited thereto. Alternatively, the glass product 100 through 103 may have one of various other shapes such as a rectangular shape with rounded corners, a square shape, a circular shape, or an elliptical shape. For convenience of illustration and description, embodiment where the glass product has a rectangular shape in a plan view will hereinafter be described in detail, but the disclosure is not limited thereto.

Figure 2:
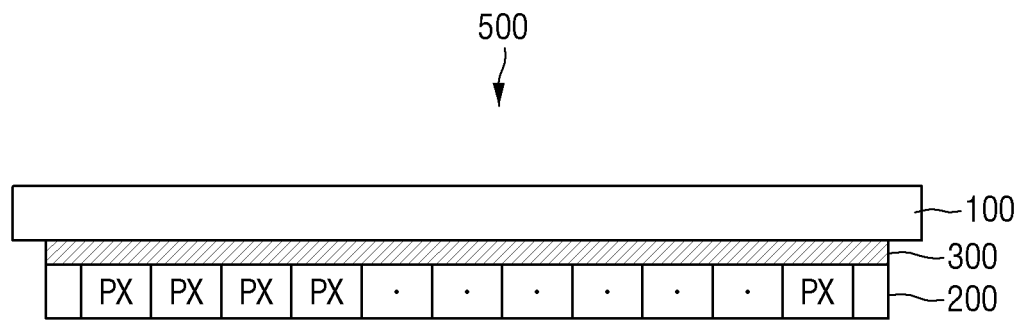
FIG. 2 is a cross-sectional view of a display device having a glass product according to an embodiment of the disclosure as a cover window.

FIG. 2 is a cross-sectional view of a display device having a glass product according to an embodiment of the disclosure as a cover window.

Referring to FIG. 2, an embodiment of a display device 500 may include a display panel 200, a cover window 100, which is disposed on the display panel 200, and an optically transparent bonding layer 300, which is disposed between the display panel 200 and the cover window 100 to couple the display panel 200 and the cover window 100 to each other.

The display panel 200 may include, for example, a light-emitting display panel such as an organic light-emitting diode ("OLED") display panel, an inorganic electroluminescent ("EL") display panel, a quantum dot light-emitting diode ("QLED") display panel, a micro light-emitting diode ("micro-LED") display panel, a nano light-emitting diode ("nano-LED") display panel, a plasma display panel ("PDP"), a field emission display ("FED") panel and a cathode-ray tube ("CRT") display panel, or a light-receiving display panel such as a liquid crystal display ("LCD") panel and an electrophoretic display ("EPD") panel.

The display panel 200 may include a plurality of pixels PX and may display an image using light emitted from the pixels PX. The display device 500 may further include a touch member (not illustrated). In an embodiment, the touch member may be incorporated into the display panel 200. In one embodiment, for example, the touch member may be formed directly on a display member of the display panel 200 so that the display panel 200 may perform a touch function. In an alternative embodiment, the touch member may be fabricated separately from the display panel 200 and may be attached to the top surface of the display panel 200 via the optically transparent bonding layer 300.

The cover window 100 is disposed above the display panel 200. The cover window 100 protects the display panel 200. A strengthened glass product 100 may be used as the main body of the cover window 100. The cover window 100 may be larger in size than the display panel 200 and may thus protrude beyond the sides of the display panel 200, but the disclosure is not limited thereto. The cover window 100 may include a printed layer, which is disposed on at least one surface of the glass product 100 on the edges of the glass product 100. The printed layer of the cover window 100 may prevent the bezel of the display device 500 from becoming visible from the outside of the display device 500 and may perform a decorative function.

The optically transparent bonding layer 300 is disposed between the display panel 200 and the cover window 100. The optically transparent bonding layer 300 fixes the cover window 100 onto the display panel 200. The optically transparent bonding layer 300 may include an optically clear adhesive ("OCA") or an optically clear resin ("OCR").

An embodiment of the glass product 100 of FIG. 2 will hereinafter be described in detail.

Figure 3:
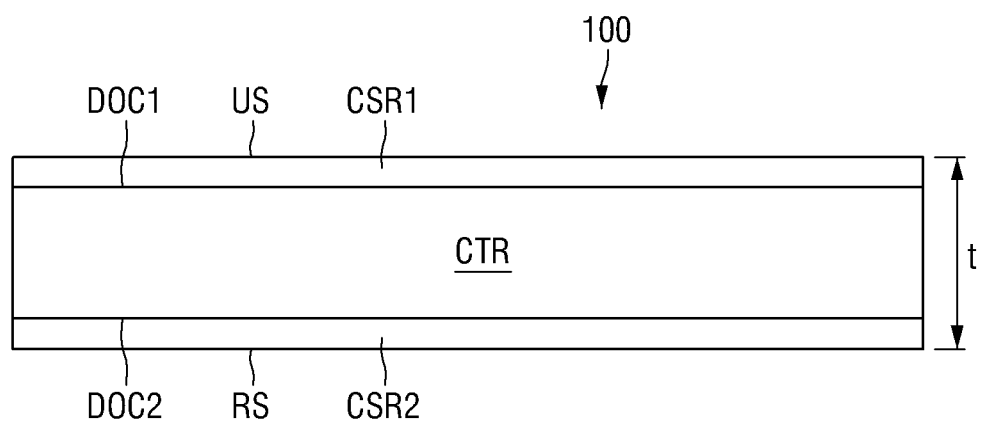
FIG. 3 is a cross-sectional view of the glass product according to an embodiment of the disclosure, which is plate-shaped.

FIG. 3 is a cross-sectional view of the glass product according to an embodiment of the disclosure, which is plate-shaped.

Referring to FIG. 3, an embodiment of the glass product 100 may include a first surface US, a second surface RS, and side surfaces SS (shown in FIG. 1). The first and second surfaces US and RS of the glass product 100 are main surfaces that have a large area, and the side surfaces of the glass product 100 may be surfaces that connect the first and second surfaces US and RS.

The first and second surfaces US and RS are opposite to each other in a thickness direction. In an embodiment where the glass product 100, like the cover window 100 of FIG. 2, transmits light therethrough, light may enter one of the first and second surfaces US and RS and may exit through the other of the first and second surfaces US and RS.

A thickness of the glass product 100 is defined as the distance between the first and second surfaces US and RS. The thickness t of the glass product 100 may be in a range of about 0.1 millimeter (mm) to about 2 mm, but the disclosure is not limited thereto. In one embodiment, for example, the thickness t of the glass product 100 may be about 0.8 mm or less. In an alternative embodiment, the thickness t of the glass product 100 may be about 0.75 mm or less. In another alternative embodiment, the thickness t of the glass product 100 may be about 0.7 mm or less. In another alternative embodiment, the thickness t of the glass product 100 may be about 0.6 mm or less. In another alternative embodiment, the thickness t of the glass product 100 may be about 0.65 mm or less. In another alternative embodiment, the thickness t of the glass product 100 may be about 0.5 mm or less. In another alternative embodiment, the thickness t of the glass product 100 may be about 0.3 mm or less. In another alternative embodiment, the thickness t of the glass product 100 may be in a range of about 0.45 mm to about 0.8 mm or in a range of about 0.5 mm to about 0.75 mm. The glass product 100 may have a uniform thickness t or may have different thicknesses t in different parts thereof.

In an embodiment, the glass product 100 may be strengthened to have a predetermined stress profile. In such an embodiment where the glass product 100 is strengthened, the strengthened glass product 100 may effectively prevent breakage and the occurrence and propagation of cracks that may be caused by external impact. The strengthened glass product 100 may have different stresses in different parts thereof. In one embodiment, for example, compressive regions (CSR1 and CSR2) in which compressive stress acts may be provided near the surfaces of the glass product 100, i.e., near the first and second surfaces US and RS, and a tensile region CTR in which tensile stress acts may be provided on the inside of the glass product 100. The stress at the boundaries between the tensile region CTR and the compressive regions (CSR1 and CSR2) may be zero. The compressive stress in each of the compressive regions (CSR1 and CSR2) may vary depending on the location (i.e., the depth from the first or second surface US or RS). Also, the stress in the tensile region CTR may vary depending on the depth from the first or second surface US or RS.

The mechanical properties of the glass product 100 such as surface strength may be considerably affected by the locations of the compressive regions (CSR1 and CSR2) in the glass product 100, the stress profiles in the compressive regions (CSR1 and CSR2), the compressive energy of the compressive regions (CSR1 and CSR2), or the tensile energy of the tensile region CTR. This will be described later in greater detail.

The glass product 100 includes a glass composition. The glass composition may include at least one selected from various compositions that are well known in the art to which the present disclosure pertains. In an embodiment, the glass composition may include a lithium-aluminum-silicon ("LAS") glass ceramic. In one embodiment, for example, the glass composition may contain 50-80 mol % of $SiO_2$, 1-30 mol % of $Al_2O_3$, 0-5 mol % of $B_2O_3$, 0-4 mol % of $P_2O_5$, 3-20 mol % of $Li_2O$, 0-20 mol % of $Na_2O$, 0-10 mol % of $K_2O$, 3-20 mol % of MgO, 0-20 mol % of CaO, 0-20 mol % of SrO, 0-15 mol % of BaO, 0-10 mol % of ZnO, 0-1 mol % of $TiO_2$, and 0-8 mol % of $ZrO_2$.

Here, the expression "0 mol % of a particular ingredient", as used herein, means that the particular ingredient is substantially not contained, which also means that the particular ingredient is not intentionally included as a raw material and encompasses a case where a very small amount of impurities, less than, for example, 0.1 mol %, is inevitably contained.

The ingredients of the glass composition will hereinafter be described. $SiO_2$, which constitutes the skeleton of glass, may improve the chemical durability of the glass product 100 and may reduce the generation of cracks when scratches (or indentations) are formed on the surface of the glass product 100. In an embodiment, $SiO_2$ may be contained in the amount of 50 mol % or greater to improve the chemical durability. In an embodiment, for sufficient meltability, $SiO_2$ may be contained in the glass composition in an amount of 80 mol % or less.

$Al_2O_3$ improves the crushability of glass. That is, $Al_2O_3$ helps glass break into fewer pieces. Also, $Al_2O_3$ may improve the performance of ion exchange during chemical strengthening and may increase the surface compressive stress of the glass product 100 after strengthening. In an embodiment, $Al_2O_3$ is contained in the glass composition in the amount of 1 mol % or greater to effectively improve the characteristics described above. In an embodiment, $Al_2O_3$ is contained in the glass composition in the amount of 30 mol % or less to maintain the acid resistance and meltability of glass.

$B_2O_3$ improves the chipping resistance and the meltability of glass. In an embodiment, $B_2O_3$ may be omitted (or contained in the amount of 0 mol %). In an alternative embodiment, $B_2O_3$ may be contained in the amount of 0.5 mol % or greater to improve the meltability of glass. In such an embodiment, the content of $B_2O_3$ may be 5 mol % or less to suppress the occurrence of chemical striae during melting.

$P_2O_5$ improves the performance of ion exchange and the chipping resistance of glass. In an embodiment, $P_2O_5$ may be omitted (or contained in the amount of 0 mol %). In an alternative embodiment, $P_2O_5$ may be contained in the amount of 0.5 mol % or greater to improve the performance of ion exchange and the chipping resistance of glass. In such an embodiment, the content of $P_2O_5$ may be 4 mol % or less to prevent significant decreases in crushability and acid resistance.

$Li_2O$ forms surface compressive stress through ion exchange. Lithium (Li) ions near the surface of glass may be exchanged with sodium (Na) ions through ion exchange. $Li_2O$ also improves the crushability of glass. In an embodiment, for an effective ion exchange, $Li_2O$ may be contained in the amount of 3 mol % or greater. In an embodiment, for desirable acid resistance, the content of $Li_2O$ may be 20 mol % or less.

$Na_2O$ forms surface compressive stress through ion exchange and improves the meltability of glass. Na ions near the surface of glass may be exchanged with potassium (K) ions through ion exchange. In an embodiment, $Na_2O$ may be omitted. In an alternative embodiment, $Na_2O$ may be contained in the amount of 1 mol or greater to effectively improve the formation of surface compressive stress and the meltability of glass. In such an embodiment, the content of $Na_2O$ may be 8 mol % or less for a smooth exchange of Li ions and Na ions if there exists the exchange of Li ions and Na ions, but not the exchange of Na ions with K ions. Even if there also exists the exchange of Na ions and K ions, the content of $Na_2O$ may be 20 mol % or less for desirable acid resistance.

$K_2O$ improves the performance of ion exchange and the crushability of glass. In an embodiment, $K_2O$ may be omitted. In an alternative embodiment, $K_2O$ may be contained in the amount of 0.5 mol % or greater to effectively improve the performance of ion exchange. In such an embodiment, the content of $K_2O$ may be 10 mol % or lower to prevent an excessive decrease in crushability.

MgO improves the surface compressive stress of chemically-strengthened glass and improves the crushability of glass. In an embodiment, the content of MgO is 3 mol % or greater to effectively improve the surface compressive stress of chemically-strengthened glass and the crushability of glass. In such an embodiment, the content of MgO may be 20 mol % or less to reduce the occurrence of devitrification during the melting of glass.

CaO improves the meltability and the crushability of glass. In an embodiment, CaO may be omitted. In an alternative embodiment, CaO may be contained in the amount of 0.5 mol % or greater to effectively improve the meltability and the crushability of glass. If CaO is contained too much, the performance of ion exchange may deteriorate. Thus, in such an embodiment, the content of CaO may be 20 mol % or less.

SrO, like CaO, improves the meltability and the crushability of glass. In embodiment, SrO may be omitted. In an alternative embodiment, SrO may be contained in the amount of 0.5 mol % or greater to effectively improve the meltability and the crushability of glass. If SrO is contained too much, the performance of ion exchange may deteriorate. Thus, in such an embodiment, the content of SrO may be 20 mol % or less.

BaO improves the meltability and the crushability of glass. In an embodiment, BaO may be omitted. In an alternative embodiment, BaO may be contained in the amount of 0.5 mol % or greater to effectively improve the meltability and the crushability of glass. In such an embodiment, the content of BaO may be 15 mol % or less to prevent an excessive decrease in the performance of ion exchange.

ZnO improves the meltability of glass. In an embodiment, ZnO may be omitted. In an alternative embodiment, ZnO may be contained in the amount of 0.25 mol % or greater to effectively improve the meltability of glass. In such an embodiment, the content of ZnO may be maintained at 10 mol % or less to prevent a decrease in weather resistance.

$TiO_2$ improves the crushability of chemically-strengthened glass. In an embodiment, $TiO_2$ may be omitted. In an alternative embodiment, $TiO_2$ may be contained in the amount of 0.1 mol % or greater to effectively improve the crushability of chemically-strengthened glass. In such an embodiment, the content of $TiO_2$ may be 1 mol % or less to prevent devitrification during melting.

$ZrO_2$ improves surface compressive stress caused by ion exchange and improves the crushability of glass. In an embodiment, $ZrO_2$ may be omitted. In an alternative embodiment, $ZrO_2$ may be contained in the amount of 0.5 mol % or greater to effectively improve the surface compressive stress and the crushability of glass. In such an embodiment, the content of $ZrO_2$ may preferably be 8 mol % or less to prevent devitrification during melting.

The glass composition may further include $Y_2O_3$, $La_2O_3$, $Nb_2O_5$, $Ta_2O_5$, and $Gd_2O_3$.

The composition of the glass product 100 may be changed by molding or ion exchange, which will be described later.

The glass composition may be molded into a plate glass by various well-known processes such as, for example, a float process, a fusion draw process, or a slot draw process.

The glass product 100 may be chemically strengthened by ion exchange that exchanges ions in glass with other ions. As a result of ion exchange, ions at or near the surface of glass may be replaced or exchanged with larger ions with the same valence or the same oxidation. For example, if glass contains monovalent alkali metals such as Li+, Na+, K+, and Rb+, the monovalent cations at the surface of the glass may be exchanged with ions with larger ionic radii, i.e., Na+, K+, Rb+, and Cs+. Ion exchange will hereinafter be described with reference to FIG. 4.

Figure 4:
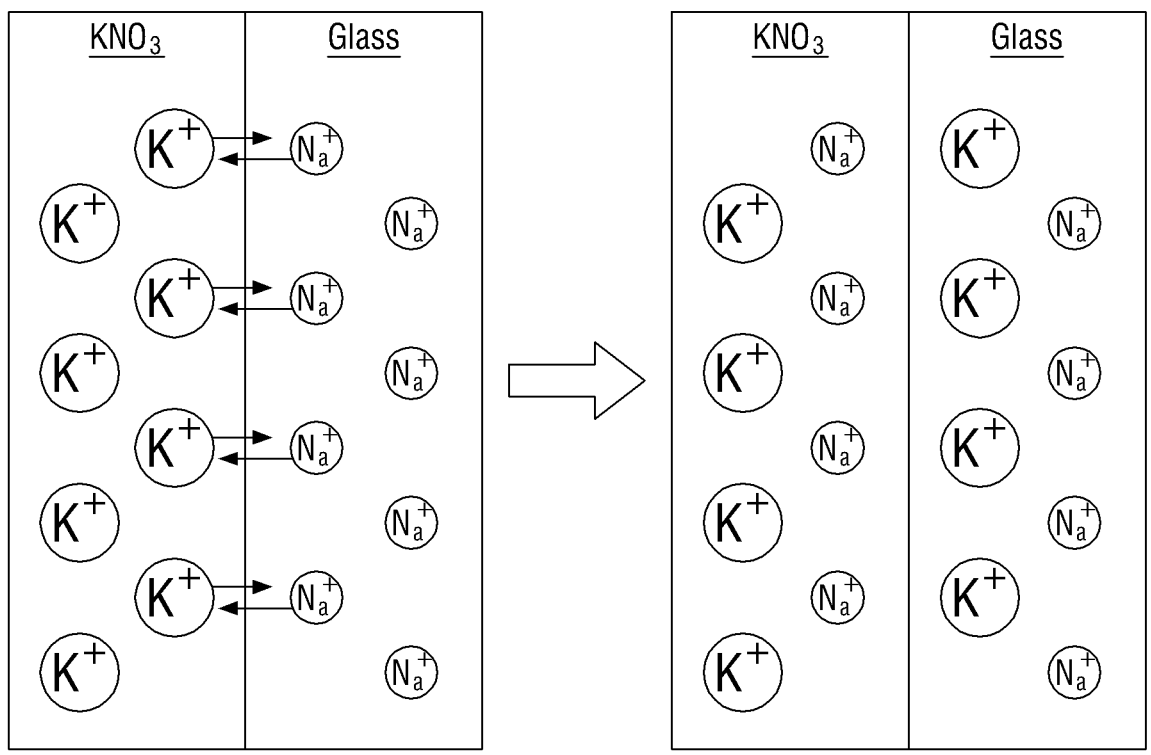
FIG. 4 is a schematic view illustrating an ion exchange process according to an embodiment of the disclosure.

FIG. 4 is a schematic view illustrating an ion exchange process according to an embodiment of the disclosure.

Specifically, FIG. 4 illustrates the exchange of Na ions in glass with K ions.

Referring to FIG. 4, when glass containing Na ions is exposed to K ions by, for example, being immersed in a molten salt bath containing potassium nitrate, the Na ions in the glass may be released and may be replaced with the K ions. The K ions that replace the Na ions in the glass produce compressive stress because K ions have a larger ionic radius than Na ions. The greater the amount of N ions replaced with K ions is, the stronger the compressive stress produced by the K ions becomes. Since ion exchange is conducted through the surface of the glass, there may exist a largest amount of K ions at the surface of the glass. Some of the K ions that replace the Na ions in the glass diffuse into the glass and may thus increase the depth of a compressive region, i.e., the depth of compression, but the amount of compressive stress may decrease as being away from the surface of the glass. Thus, the glass may have a stress profile in which compressive stress becomes greatest at the surface of the glass and decreases toward the inside of the glass. However, the disclosure is not limited to this. The stress profile of the glass may vary depending on the temperature and duration of ion exchange and the presence of thermal treatment.

In an embodiment, ion exchange may be performed at least three times. In one embodiment, for example, ion exchange may include primary, secondary, and tertiary ion exchange processes. The primary, secondary, and tertiary ion exchange processes may be performed in different baths. The primary, secondary, and tertiary ion exchange processes may be performed at the same time on multiple glasses. That is, multiple glasses may be immersed in a single bath so that ion exchange can be caused simultaneously at the multiple glasses. Ion exchange will be described later in further detail.

The stress profile of the strengthened glass product 100 will hereinafter be described.

Figure 5:
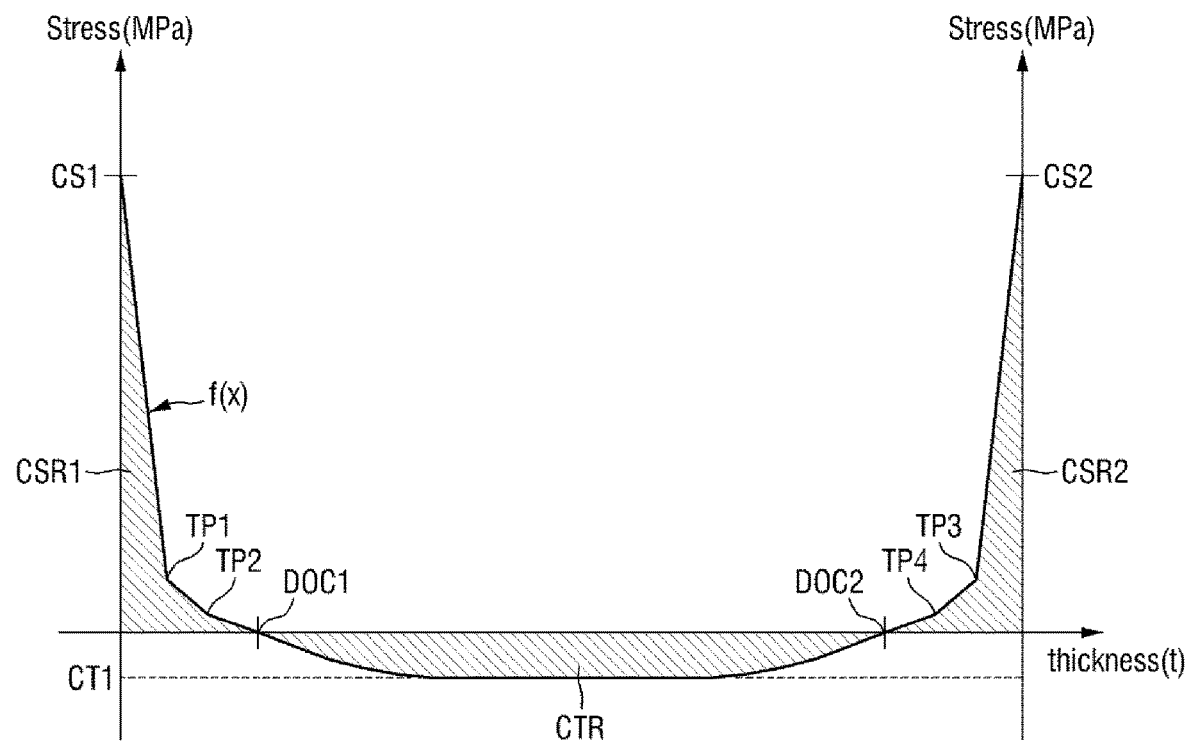
FIG. 5 is a graph showing the stress profile of the glass product according to an embodiment of the disclosure.

FIG. 5 is a graph showing the stress profile of a glass product according to an embodiment of the disclosure. Referring to FIG. 5, an X axis represents the thickness direction of the glass product 100. In the graph of FIG. 5, compressive stress is represented as a positive value, and tensile stress is represented as a negative value. However, the magnitude of the compressive/tensile stress is represented by the absolute value of the compressive/tensile stress.

Referring to FIG. 5, the glass product 100 includes a first compressive region CSR1, which extends (or expands) to a first compression depth DOC1 from the first surface US, and a second compressive region CSR2, which extends (or expands) to a second compression depth DOC2 from the second surface RS. Herein, the first compression depth DOC1 and the second compression depth DOC2 may be points from the first surface US and the second surface RS, respectively, where stress becomes zero. A tensile region CTR is disposed between the first and second compression depths DOC1 and DOC2. In the stress profile in the glass product 100, compressive/tensile regions between the first and second surfaces US and RS of the glass product 100 may be symmetrical with respect to a center point in a direction of the thickness t. Although not specifically illustrated in FIG. 5, compressive/tensile regions may be arranged between the sides of the glass product 100 in a similar manner to those between the first and second surfaces US and RS of the glass product 100.

The first and second compressive regions CSR1 and CSR2 prevents the glass product 100 from cracking or breaking due to external impact. As maximum compressive stresses CS1 and CS2 of the first and second compressive regions CSR1 and CSR2 increase, the strength of the glass product 100 generally increases. Since external impact is generally delivered through the surfaces of the glass product 100, it is desired, in terms of durability, that the glass product 100 has the maximum compressive stresses CS1 and CS2 at the surfaces thereof. The compressive stresses of the first and second compressive regions CSR1 and CSR2 tend to decrease in a direction from the surfaces to the inside of the glass product 100.

The first and second compression depths DOC1 and DOC2 suppresses the propagation of cracks or indentations formed on the first and second surfaces US and RS into the tensile region CTR inside the glass product 100. The greater the first and second compression depths DOC1 and DOC2, the better the suppression of the propagation of cracks. Locations corresponding to the first and second compression depths DOC1 and DOC2 correspond to the boundaries between the tensile region CTR and the first and second compression regions CSR1 and CSR2, and the stress at the first and second compression depths DOC1 and DOC2 is zero.

The tensile stress of the tensile region CTR may be balanced with the compressive stresses of the first and second compression regions CSR1 and CSR2 throughout the glass product 100. That is, the sum of compressive stresses (i.e., compressive energy) in the glass product 100 may be the same as the sum of tensile stresses (i.e., tensile energy) in the glass product 100. Stress energy accumulated in one region in the glass product 100 with a uniform thickness in the thickness direction of the glass product 100 may be calculated by integrating the stress profile of the glass product 100, as indicated by Equation (1):

$$\int_0^t f(x)dx = 0 \tag{1}$$

In Equation (1), f(x) denotes the stress profile of the glass product 100, and t denotes the thickness of the glass product 100.

As the magnitude of the tensile stress in the glass product 100 increases, the risk of the glass product 100 breaking violently into fragments and being crushed from the inside out may increase. A maximum tensile stress $CT_1$ that satisfies the fragility criterion of the glass product 100 may satisfy, but is not limited to, Inequality (2):

$$CT_1 \le -38.7 \times \ln(t) + 48.2 \tag{2}$$

In an embodiment, the maximum tensile stress $CT_1$ may be about 100 megapascals (MPa) or less, e.g., about 85 MPa or less. In such an embodiment, the maximum tensile stress $CT_1$ may be about 75 MPa or greater to improve the mechanical characteristics (such as strength) of the glass product 100. In an embodiment, the maximum tensile stress $CT_1$ may be in a range of about 75 MPa to about 85 MPa, but the disclosure is not limited thereto.

The maximum tensile stress $CT_1$ may be located at the center, in the thickness direction, of the glass product 100. In one embodiment, for example, the maximum tensile stress $CT_1$ may be located at a depth in a range of about 0.4t to about 0.6t, about 0.45t to about 0.55t, or about 0.5t.

In an embodiment, the maximum compressive stresses CS1 and CS2 and the first and second compression depths DOC1 and DOC2 may be desired to be great to improve the strength of the glass product 100. However, as compressive energy increases, tensile energy and the maximum tensile stress $CT_1$ may both increase. In an embodiment, the stress profile of the glass product 100 may preferably be adjusted such that the maximum compressive stresses CS1 and CS2 and the compression depths DOC1 and DOC2 may become as large as possible to achieve high strength and meet the fragility criterion of the glass product 100, but the compressive energy may decrease. Accordingly, in an embodiment, the first and second compressive regions CSR1 and CSR2 may include transition points at which the slope of the stress profile of the glass product 100 changes rapidly. However, in a case where cracks are generated on the first and second surfaces US and RS of the glass product 100 due to external impact, the cracks may penetrate into a depth in a range of about 30 micrometers (m) to about 50 μm from the first and second surfaces US and RS of the glass product 100. In an embodiment, the stress at a depth of about 30 μm to about 50 μm from the first and second surfaces US and RS of the glass product 100 may be increased to improve resistance against the cracks.

In an embodiment, primary and tertiary ion exchange processes may be performed to achieve high strength and meet the fragility criterion of the glass product 100, and a secondary ion exchange process may be further performed between the primary and tertiary ion exchange processes to improve resistance against cracks.

In such an embodiment, as a result of the primary, secondary, and tertiary ion exchange processes, the glass product 100 may include first and second transition points TP1 and TP2 in the first compressive region CSR1 and third and fourth transition points TP3 and TP4 in the second compressive region CSR2. The stress profile of the glass product 100 may be precisely adjusted by controlling the conditions for the primary, secondary, and tertiary ion exchange processes.

The stress profiles in the first and second compressive regions CSR1 and CSR2 will hereinafter be described with reference to FIGS. 6 and 7. Since the stress profiles in the first and second compressive regions CSR1 and CSR2 are symmetrical with each other, the description of the stress profile of the second compressive region CSR2 will be omitted, or simplified for convenience of description.

Figure 6:
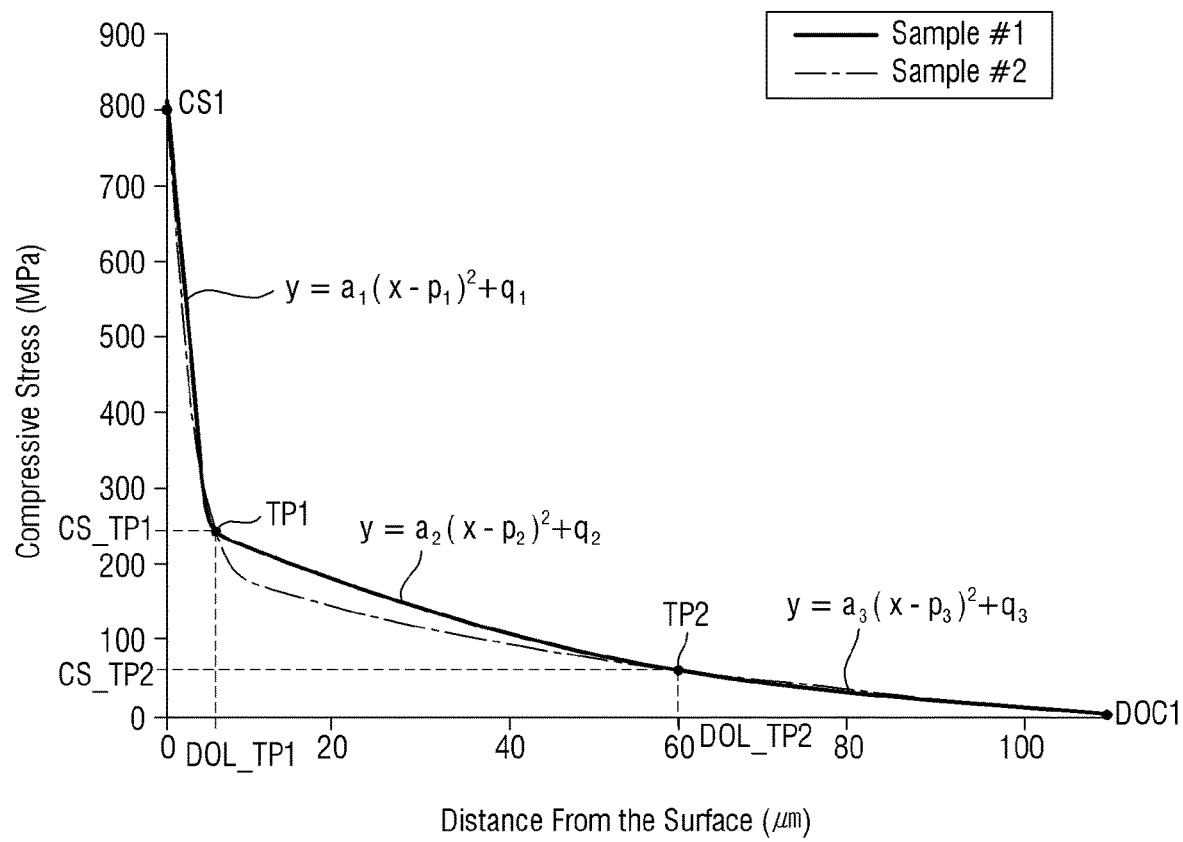
FIG. 6 is a graph showing a first compressive region of FIG. 5.
Figure 7:
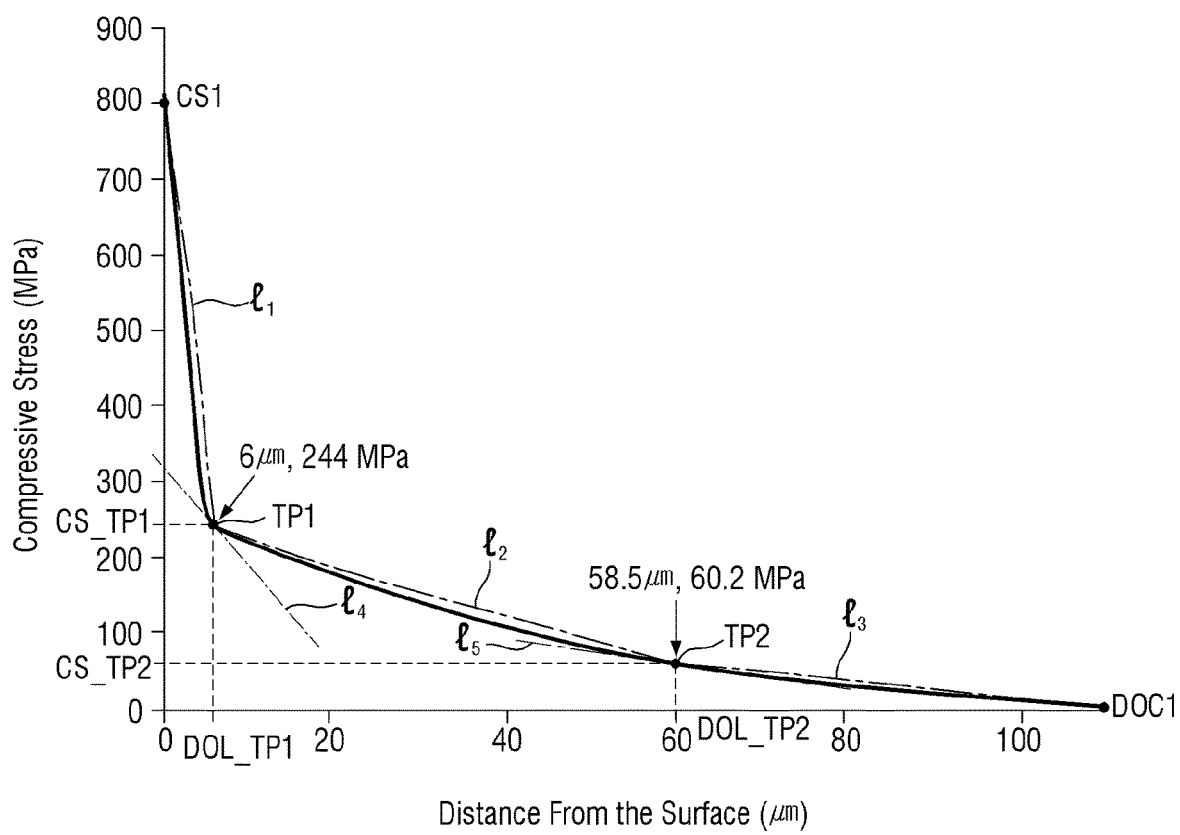
FIG. 7 is a graph showing a first mean slope of a first trend line, a second mean slope of a second trend line, a third mean slope of a third trend line, a first tangential slope at a first transition point, and a second tangential slope at a second transition point.

FIG. 6 is a graph showing the first compressive region of FIG. 5, and FIG. 7 is a graph showing a first mean slope of a first trend line, a second mean slope of a second trend line, a third mean slope of a third trend line, a first tangential slope at a first transition point, and a second tangential slope at a second transition point. Referring to FIG. 6, sample #1 denotes a triple-strengthened glass product 100 according to an embodiment, and sample #2 denotes a double-strengthened glass product according to a comparative example.

Referring to FIGS. 6 and 7, the stress profile in the first compressive region CSR1 may include first, second, and third trend lines.

The first, second, and third trend lines have a negative slope, and the slope of the first, second, and third trend lines gradually increase in the order of the first trend line, the second trend line and the third trend line.

The stress profile in the first compressive region CSR1 includes at least two transition points at which the slope of the stress profile in the first compressive region CSR1 changes rapidly, i.e., the first and second transition points TP1 and TP2.

The first transition point TP1 is located between the first surface US and the first compression depth DOC1. The stress profile in the first compressive region CSR1 may be divided into the first and second trend lines by the first transition point TP1. That is, the stress profile in the first compressive region CSR1 may include the first trend line that extends from the first surface US to the first transition point TP1.

The second transition point TP2 is located between the first transition point TP1 and the first compression depth DOC1. The stress profile in the first compressive region CSR1 may be divided into the second and third trend lines by the second transition point TP2. That is, the stress profile in the first compressive region CSR1 may further include the second trend line that extends from the first transition point TP1 to the second transition point TP2 and the third trend line that extends from the second transition point TP2 to the first compression depth DOC1.

The first, second, and third trend lines may be determined or distinguished from one another by the types of ions penetrated into the glass product 100. In one embodiment, for example, K ions may penetrate into a range of depths corresponding to the first trend line located in the first compressive region CSR1, relatively close to the first surface US, and a much less amount of K ions than the amount of K ions penetrated into the range of depths corresponding to the first trend line may penetrate into a range of depths corresponding to the second trend line. However, K ions may not substantially penetrate into a range of depths corresponding to the third trend line. On the contrary, Na ions, which have a smaller ionic size than K ions, may penetrate not only into the range of depths corresponding to the second trend line, but also into the range of depths corresponding to the third trend line.

The stress of the first trend line, which is located in the first compressive region CSR1, relatively close to the first surface US, may be determined by the density of K ions. The first trend line may further include Na ions, but the stress of the first trend line may depend largely on the density of K ions, which have a larger ionic size than Na ions. In the range of depths corresponding to the first trend line, the greater the density of K ions is, the higher the stress is, and the more the stress profile of the first trend line approximates the density profile of the K ions. The first transition point TP1 may correspond to the maximum penetration depth of K ions.

The stress of the second trend line, which is located relatively on the inside of the first compressive region CSR1, as compared to the first trend line, may be determined by the density of a much less amount of K ions than the K ions penetrated to form the first trend line, and mainly determined by the density of Na ions. That is, in the range of depths corresponding to the second trend line, the greater the densities of K ions and Na ions are, the higher the stress is, and the more the stress profile of the second trend line approximates the density profiles of the K ions and the Na ions.

The stress of the third trend line, which is located on the furthest inside of the first compressive region CSR1, may be determined by the density of Na ions. That is, in the range of depths corresponding to the third trend line, the greater the density of Na ions is, the higher the stress is, and the more the stress profile of the third trend line approximates the density profile of the Na ions.

The first trend line may be represented by a first function, which is a quadratic function that may be drawn on a coordinate plane having depth as its x axis and stress as its y axis. The first function may be expressed by Equation (3):

$$y=a_1(x-p1)^2+q1 \qquad (3)$$

In Equation (3), $a_1$, which is the coefficient of the quadratic term, determines the shape and slope of the first function, p1 denotes the x-axis coordinate of the vertex of the first function, i.e., depth, and q1 denotes the y-axis coordinate of the vertex of the first function, i.e., stress.

The second trend line may be represented by a second function, which is a quadratic function that can be drawn on a coordinate plane having depth as its x axis and stress as its y axis. The second function may be expressed by Equation (4):

$$y=a_2(x-p2)^2+q2 \qquad (4)$$

In Equation (4), $a_2$, which is the coefficient of the quadratic term, determines the shape and slope of the second function, p2 denotes the x-axis coordinate of the vertex of the second function, i.e., depth, and q2 denotes the y-axis coordinate of the vertex of the second function, i.e., stress.

The third trend line may be represented by a third function, which is a quadratic function that can be drawn on a coordinate plane having depth as its x axis and stress as its y axis. The third function may be expressed by Equation (5):

$$y=a_3(x-p3)^2+q3 \qquad (5)$$

In Equation (5), $a_3$, which is the coefficient of the quadratic term, determines the shape and slope of the third function, p3 denotes the x-axis coordinate of the vertex of the third function, i.e., depth, and q3 denotes the y-axis coordinate of the vertex of the third function, i.e., stress.

Referring to Equations (3), (4), and (5), the coefficients $a_1$, $a_2$, and $a_3$ may all be positive. That is, all first tangential slopes of the first trend line may be negative, all second tangential slopes of the second trend line may be negative, and all third tangential slopes of the third trend line may be negative.

The coefficient $a_1$ of the first function may be greater than the coefficients $a_2$ and $a_3$ of the second and third functions, and the coefficient $a_2$ of the second function may be greater than the coefficient $a_3$ of the third function. That is, the slope of the first function may be greater than the slopes of the second and third functions, and the width of the first, second, third functions may gradually increase from the first function to the second function to the third function.

In an embodiment, a compressive stress CS at the first surface US may be in a range of about 700 MPa to about 950 MPa, and the first compression depth DOC1 may be in a range of about 125 μm to about 135 μm.

In such an embodiment, the x-axis coordinate p1 of the vertex of the first function may have a value in a range of about 5 μm to about 50 μm, the x-axis coordinate p2 of the vertex of the second function may have a value in a range of about 50 μm to about 150 μm, the x-axis coordinate p3 of the vertex of the third function may have a value in a range of about 160 μm to about 250 μm, the y-axis coordinate q1 of the vertex of the first function may have a value in a range of 100 MPa to about 300 MPa, the y-axis coordinate q2 of the vertex of the second function may have a value in a range of about 5 MPa to about 80 MPa, and the y-axis coordinate q3 of the vertex of the third function may have a value in a range of about −60 MPa to about 0 MPa.

The slope of the stress profile of the glass product 100 changes rapidly at the first and second transition points TP1 and TP2.

An x-axis coordinate DOL_TP1 of the first transition point TP1 (i.e., the depth of the first transition point TP1 from the first surface US) may be about 20 μm or less or about 10 μm or less.

A y-axis coordinate CS_TP1 of the first transition point TP1 (i.e., the stress at the first transition point TP1) may have a value of about 20 MPa or greater.

An x-axis coordinate DOL_TP2 of the second transition point TP2 (i.e., the depth of the second transition point TP2 from the first surface US) may have a value in a range of about 50 μm to about 80 μm.

A y-axis coordinate CS_TP2 of the second transition point TP2 (i.e., the stress at the second transition point TP2) may have a value be in a range of about 40 MPa to about 100 MPa.

When the x-axis coordinate DOL_TP1 of the first transition point TP1 (i.e., the depth of the first transition point TP1 from the first surface US) is about 20 μm or less or about 10 μm or less, the y-axis coordinate CS_TP1 of the first transition point TP1 (i.e., the stress at the first transition point TP1) is about 200 MPa or greater, and when the x-axis coordinate DOL_TP2 of the second transition point TP2 (i.e., the depth of the second transition point TP2 from the first surface US) ranges from about 50 μm to about 80 μm, the y-axis coordinate CS_TP2 of the second transition point TP2 (i.e., the stress at the second transition point TP2) ranges from about 40 MPa to about 100 MPa. Thus, when cracks are generated on the first and second surfaces US and RS of the glass product 100 due to external impact, the resistance against cracks that may penetrate into a depth in a range of about 30 μm to about 50 μm from the first and second surfaces US and RS of the glass product 100 may be secured. That is, since the glass product 100 has a stress of about 100 MPa or greater at a depth in a range of about 30 μm to about 50 μm from the first and second surfaces US and RS thereof, the depth of cracks may be accepted, and the crack resistance of the glass product 100 may be improved.

In such an embodiment, the stress of the glass product 100 may be increased at a depth of about 30 μm to about 50 μm from the first and second surfaces US and RS of the glass product 100 to improve the resistance against cracks.

Referring to FIG. 7, a segment $l_1$ between the first surface US and the first transition point TP1 may be represented as a fourth function, which is a linear function that can be drawn on a coordinate plane having depth as its x axis and stress as its y axis. The fourth function may be expressed by Equation (6):

$$y=a_4x+b1 \qquad (6)$$

In Equation (6), $a_4$, which is the coefficient of the primary term, determines the shape and slope of the fourth function and b1 denotes the stress at the first surface US.

A segment $l_2$ between the first and second transition points TP1 and TP2 may be represented as a fifth function, which is a linear function that can be drawn on a coordinate plane having depth as its x axis and stress as its y axis. The fifth function may be expressed by Equation (7):

$$y=a_5x+b2 \qquad (7)$$

In Equation (7), $a_5$, which is the coefficient of the primary term, determines the shape and slope of the fifth function, and b2 denotes the stress at the first surface US.

A segment $l_3$ between the second transition point TP2 and the first compression depth DOC1 may be represented as a sixth function, which is a linear function that can be drawn on a coordinate plane having depth as its x axis and stress as its y axis. The sixth function may be expressed by Equation (8):

$$y=a_6x+b3 \qquad (8)$$

In Equation (8), $a_6$, which is the coefficient of the primary term, determines the shape and slope of the sixth function, and b3 denotes the stress at the first surface US.

Referring to Equations (6) through (8) and FIG. 7, the coefficients $a_4$ through $a_6$ may all be negative, the absolute value of the coefficient $a_4$ may be greater than the absolute values of the coefficients as and $a_6$, and the absolute value of the coefficient as may be greater than the absolute value of the coefficient $a_6$.

A tangent $l_4$ at the first transition point TP1 may be represented as a seventh function, which is a linear function that can be drawn on a coordinate plane having depth as its x axis and stress as its y axis. The seventh function may be expressed by Equation (9):

$$y=a_7x+b4 \qquad (9)$$

In Equation (9), $a_7$, which is the coefficient of the primary term, determines the shape and slope of the seventh function, and b4 denotes the stress at the first surface US.

A tangent $l_5$ is at the second transition point TP2 may be represented as an eighth function, which is a linear function that can be drawn on a coordinate plane having depth as its x axis and stress as its y axis. The eighth function may be expressed by Equation (10):

$$y = a_8 x + b5 \quad (10)$$

In Equation (10), $a_8$, which is the coefficient of the primary term, determines the shape and slope of the eighth function, and b5 denotes the stress at the first surface US.

Referring to Equations (6) through (10) and FIG. 7, the coefficients $a_7$ and as may both be negative, the absolute value of the coefficient $a_7$ may be between the absolute values of the coefficients $a_4$ and as, and the absolute value of the coefficient as may be between the absolute values of the coefficients $a_5$ and $a_6$.

Referring again to FIGS. 6 and 7, the first, second, and third trend lines, which have different slopes, may be obtained by multiple ion exchange processes. The third trend line may be obtained by a primary ion exchange process, the second trend line may be obtained by a secondary ion exchange process, and the first trend line may be obtained by a tertiary ion exchange process.

Herein, the primary ion exchange process is a process of imparting the first and second compression depths DOC1 and DOC2 to the glass product 100 and includes exposing the glass product 100 to a single molten salt containing Na ions or a mixed molten salt containing K ions and Na ions. In one embodiment, for example, in the primary ion exchange process, the glass product 100 is put in a first bath containing a single molten salt including sodium nitrate or a mixed molten salt having potassium nitrate and sodium nitrate mixed therein. In an embodiment where the mixed molten salt is used, the contents of potassium nitrate and the sodium nitrate in the first bath may be similar as each other, but alternatively, the content of the sodium nitrate may be greater than the content of the potassium nitrate. In one embodiment, for example, the ratio of potassium nitrate to sodium nitrate in the mixed molten salt may be adjusted in the range of 40:60 to 50:50. In one embodiment, the ratio of potassium nitrate to sodium nitrate in the mixed molten salt may be 40:60, but the disclosure is not limited thereto.

The primary ion exchange process may be performed at a temperature in a range of ±20° C. from a temperature 50° C. below the glass transition temperature. In one embodiment, for example, where the glass transition temperature is 580° C., the primary ion exchange process may be performed at a temperature of about 500° C. or higher. The primary ion exchange process may be performed for 3 to 8 hours, but the disclosure is not limited thereto.

As a result of the primary ion exchange process, the Li/Na ions in the glass product 100, which are relatively small ions, may be exchanged with the Na/K ions, which are larger than the Li/Na ions, in the molten salt in the first bath, so that the concentration of Na/K ions in the glass product 100 may increase. Since the molten salt is provided with the Li ions from the glass product 100, the molten salt in the first bath may include the Li ions in addition to the Na/K ions.

After the primary ion exchange process and before the secondary ion exchange process, a stress relief process (or an annealing process) may be performed. The stress relief process may be performed at a temperature of about 500° C. or higher for 1 hour to 3 hours. As a result of the stress relief process, maximum compressive stress may be reduced, and compression depth may increase because of the diffusion of the Na/K ions into the glass product 100. The stress relief process may be performed in the air or in a liquid. Alternatively, the stress relief process may be omitted.

Once the primary ion exchange process (or the stress relief process) is complete, a stress profile corresponding to the third trend line may be generated in the glass product 100. That is, the Na/K ions penetrate and diffuse into the glass product 100 in the depth direction of the glass product 100. The Na ions diffuse to the first compression depth DOC1 to form the first compressive region CSR1, which has compressive stress from the first surface US to the first compression depth DOC1. That is, the first compression depth DOC1 is determined by the primary ion exchange process and/or the stress relief process.

The density of ions is generally inversely proportional to the diffusion distance of the ions. Since the Na ions and the K ions penetrate and diffuse into the glass product 100 in the depth direction of the glass product 100 through ion exchange, the concentrations of the Na and K ions may generally linearly decrease as being away from the first surface US.

Also, the degree of diffusion of ions is inversely proportional to the size of the ions. That is, the greater the size of ions is, the more the ions diffuse. Thus, if Na ions and K ions both penetrate into the glass product 100 through the primary ion exchange process, the Na ions, which are smaller than the K ions, may diffuse and penetrate deeper into the glass product 100 than the K ions. The Na ions diffuse to the first compression depth DOC1, but the K ions may diffuse only up to a depth corresponding to the second transition point TP2.

The first compression depth DOC1 has a close correlation with the maximum diffusion depth of the Na ions, which are relatively small ions and exchanged. The first compression depth DOC1 may be the same as, or close to, the maximum diffusion depth of the Na ions and may be generally proportional to the maximum diffusion depth of the Na ions. The primary ion exchange process (and/or the stress relief process), which is a process of forming the first compression depth DOC1 through the diffusion of ions, may be performed for a long time enough for ions to sufficiently diffuse into the glass product 100.

A stress profile generated by the Na ions penetrated into the glass product 100 through the primary ion exchange process may correspond to the third trend line.

The stress in each region may vary depending on the size of ions diffused therein. As described above, in a case where cracks are generated on the first and second surfaces US and RS of the glass product 100 due to external impact, the cracks may penetrate into a depth in a range of about 30 μm to about 50 μm from the first and second surfaces US and RS of the glass product 100. However, since Na ions are small in size, the stress for resisting cracks may not be able to be secured sufficiently at the depth of cracks. That is, there is a limit in securing sufficient stress for resisting cracks at a depth in a range of about 30 μm to about 50 μm from the first and second surfaces US and RS of the glass product 100, if only the primary ion exchange process is performed. Thus, in an embodiment, the secondary ion exchange process may be additionally performed after the primary ion exchange process to secure sufficient stress at a depth of about 30 μm to about 50 μm from the first and second surfaces US and RS of the glass product 100.

In an embodiment, the secondary ion exchange process is a process of increasing the stress at a depth between the first and second transition points TP1 and TP2 of the stress profile of the glass product 100, for example, at a depth in a range of about 30 μm to about 50 μm from the first and second surfaces US and RS of the glass product 100, and includes exposing the glass product 100 to a mixed molten salt containing K ions and Na ions. In one embodiment, for example, in the secondary ion exchange process, the glass product 100 that has been subjected to the primary ion exchange process is put in a second bath containing a mixed molten salt having potassium nitrate and sodium nitrate mixed therein. The content of potassium nitrate in the second bath may be greater than the content of potassium nitride in the first bath. In one embodiment, for example, the ratio of sodium nitrate to potassium nitrate in the mixed molten salt may be adjusted to be in a range of about 40:60 to about 60:40. In one embodiment, for example, the ratio of sodium nitrate to potassium nitrate in the mixed molten salt may be about 50:50, but the disclosure is not limited thereto.

The secondary ion exchange process may be performed at a lower temperature, and for a shorter time, than the primary ion exchange process. In one embodiment, for example, the secondary ion exchange process may be performed at a temperature in a range of about 380° C. to about 460° C. for 1 to 3 hours or for 1.3 to 2 hours.

As a result of the secondary ion exchange process, the stress at a depth between the first and second transition points TP1 and TP2, e.g., at a depth in a range of about 30 μm to about 50 μm from the first and second surfaces US and RS of the glass product 100, may increase. Specifically, the amount of K ions penetrated into a depth between the first and second transition points TP1 and TP2 by the secondary ion exchange process may be greater than the amount of K ions penetrated into the second transition point TP2 or the first compression depth DOC1 by the primary ion exchange process. That is, K ions may penetrate into a depth between the first and second transition points TP1 and TP2, e.g., a depth in a range of about 30 μm to about 50 μm from the first and second surfaces US and RS of the glass product 100, and may thus increase the stress at the corresponding depth due to their relatively large size.

A stress profile generated by K ions penetrated into a depth between the first and second transition points TP1 and TP2 through the secondary ion exchange process may correspond to the second trend line.

However, in the secondary ion exchange process, the contents of K and N ions do not much differ from each other in the secondary ion exchange process, and thus, there is a limit in increasing the maximum compressive stress CS1 at the first surface US. Therefore, in an embodiment, the tertiary ion exchange process may be additionally performed after the secondary ion exchange process to generate a greater maximum compressive stress CS1.

The tertiary ion exchange process is a process of increasing the maximum compressive stress CS1 and includes exposing the glass product 100 to a single molten salt containing K ions or a mixed molten salt containing K ions and Na ions. In one embodiment, for example, in the tertiary ion exchange process, the glass product 100 that has been subjected to the secondary ion exchange process is put in a third bath containing a single molten salt containing potassium nitrate or a mixed molten salt having potassium nitrate and sodium nitrate mixed therein. In an embodiment where the mixed molten salt is used for the tertiary ion exchange process, the ratio of the potassium nitrate to the sodium nitrate is adjusted in a way such that mainly K ions can penetrate into the glass product 100. In such an embodiment, the content of potassium nitrate in the third bath may be greater than the content of potassium nitrate in the second bath, and the concentration of potassium nitrate in the third bath may be greater than the concentration of sodium nitrate in the third bath. In one embodiment, for example, the ratio of potassium nitrate to sodium nitrate in the mixed molten salt may be adjusted to be in a range of about 80:20 to about 98:2. In one embodiment, for example, the ratio of potassium nitrate to sodium nitrate in the mixed molten salt may be about 92:8, but the disclosure is not limited thereto.

The tertiary ion exchange process may be performed at a lower temperature, and for a shorter time, than the primary ion exchange process. In one embodiment, for example, the tertiary ion exchange process may be performed at a temperature in a range of about 380° C. to about 460° C. for 1 to 3 hours or for 1.3 to 2 hours.

As a result of the tertiary ion exchange process, compressive stress in a shallow-depth section at the first surface US of the glass product 100 may considerably increase. A stress profile generated by K ions additionally penetrated into the glass product 100 through the tertiary ion exchange process may correspond to the first trend line.

Figure 8:
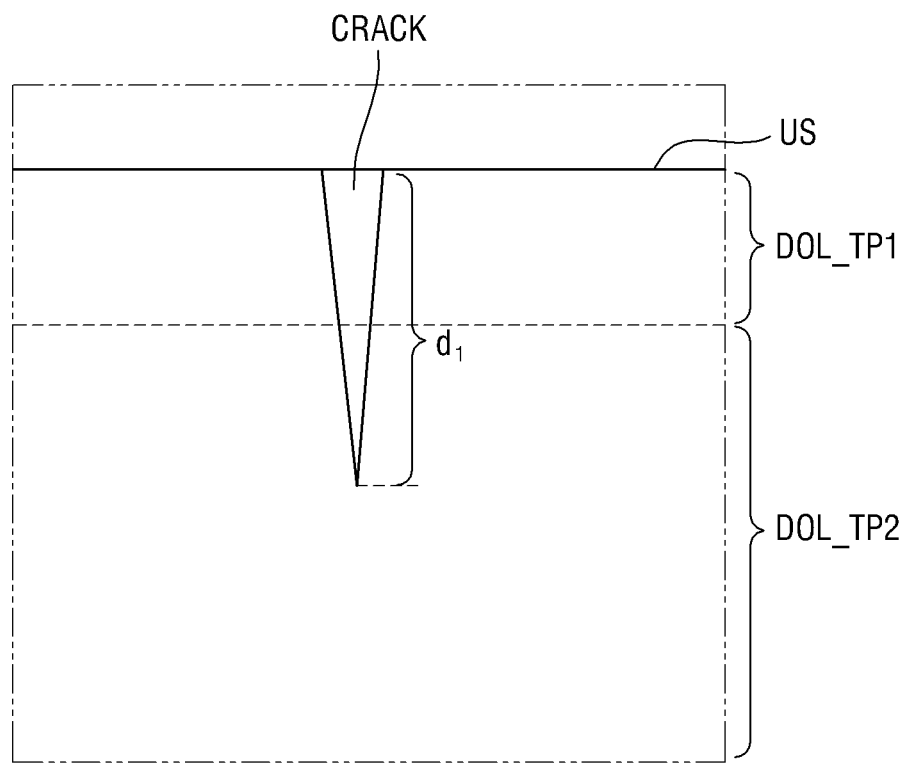
FIG. 8 is a cross-sectional view illustrating the crack resistance of the glass product according to an embodiment of the disclosure.

FIG. 8 is a cross-sectional view illustrating the crack resistance of a glass product according to an embodiment of the disclosure.

Referring to FIG. 8, a penetration depth $d_1$ of a crack may be in a range of about 30 μm to about 50 μm.

In an embodiment where between the primary and tertiary ion exchange processes, the secondary ion exchange process is additionally performed in a bath with a larger amount of potassium than that used in the primary ion exchange process, the stress in a depth section of the glass product 100 between the depth of the first transition point TP1, i.e., DOL_TP1, and the depth of the second transition point TP2, i.e., DOL_TP2, may be increased, such that the crack resistance of the glass product 100 may be improved.

Figure 9:
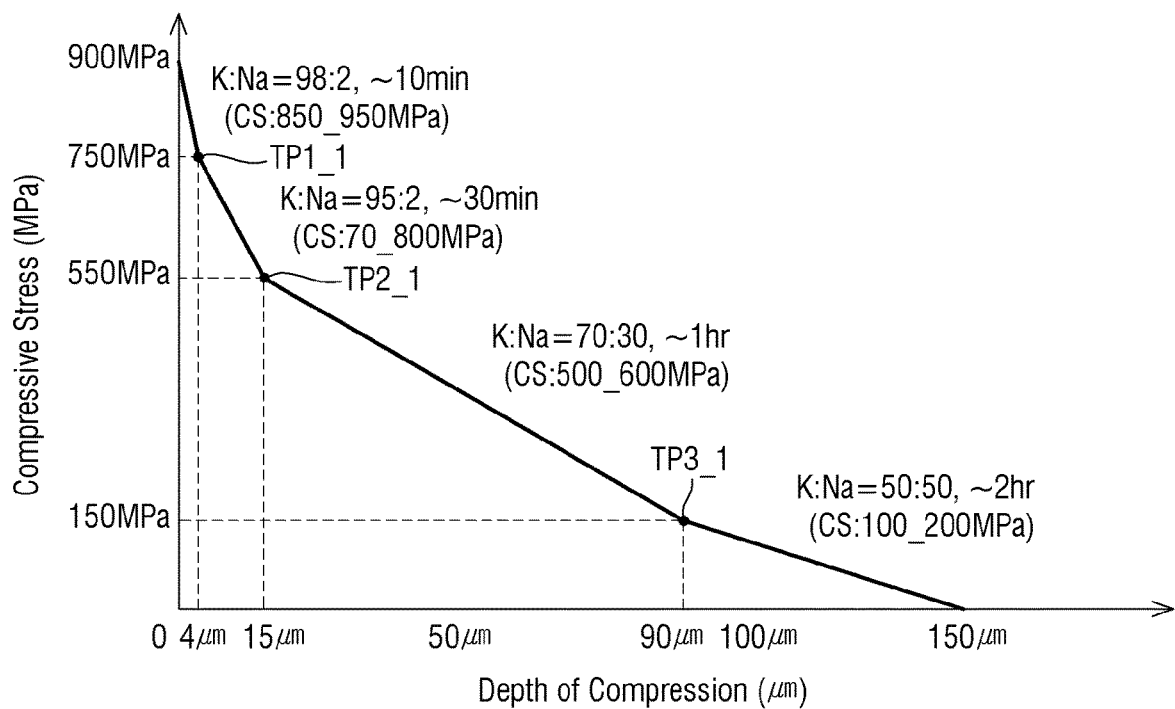
FIG. 9 is a graph showing the stress profile of a glass product according to an alternative embodiment of the disclosure.
Figure 10:
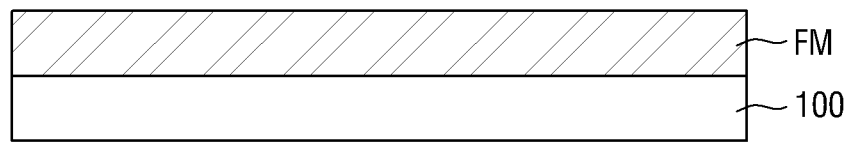
FIG. 10 is a cross-sectional view of the glass product of FIG. 9 with a scattering layer coupled thereto.

FIG. 9 is a graph showing the stress profile of a glass product according to an alternative embodiment of the disclosure, and FIG. 10 is a cross-sectional view of the glass product of FIG. 9 with a scattering layer coupled thereto.

Referring to FIGS. 9 and 10, the stress profile of a glass product 100 is obtained by performing a total of four ion exchange processes. Accordingly, the stress profile of a glass product 100 of FIGS. 9 and 10 may differ from the stress profile of the glass product 100 of FIGS. 3 through 8 in that a first compressive region CSR1 includes three transition points.

In such an embodiment, since a total of four ion exchange processes are performed, the first compressive region CSR1 includes three transition points, i.e., first, second, and third transition points TP1_1, TP2_1, and TP3_1.

An x-axis coordinate DOL_TP1_1 of the first transition point TP1_1 (i.e., the depth from a first surface US to the first transition point TP1_1) may be about 10 μm or less.

A y-axis coordinate CS_TP1_1 of the first transition point TP1_1 (i.e., stress at the first transition point TP1_1) may be about 700 MPa to about 800 MPa.

An x-axis coordinate DOL_TP2_1 of the second transition point TP2_1 (i.e., the depth from the first surface US to the second transition point TP2_1) may be in a range of about 15 μm to about 30 μm.

A y-axis coordinate CS_TP2_1 of the second transition point TP2_1 (i.e., stress at the second transition point TP2_1) may be in a range of about 500 MPa to about 600 MPa.

An x-axis coordinate DOL_TP3_1 of the third transition point TP3_1 (i.e., the depth from the first surface US to the third transition point TP3_1) may be in a range of about 80 μm to about 100 μm.

A y-axis coordinate CS_TP3_1 of the third transition point TP3_1 (i.e., stress at the third transition point TP3_1) may be in a range of about 100 MPa to about 200 MPa.

The stress profile of the glass product 100 may include a first trend line from the first surface US to the first transition point TP1_1, a second trend line from the first transition point TP1_1 to the second transition point TP2_1, a third trend line from the second transition point TP2_1 to the third transition point TP3_1, and a fourth trend line from the third transition point TP3_1 to a first compressive depth DOC1.

The first, second, third, and fourth trend lines may all have a negative average slope. The absolute value of the average slope of the first, second, third, and fourth trend lines may decrease from the first trend line to the second trend line to the third trend line to the fourth trend line.

The fourth trend line may be obtained by a primary ion exchange process performed for about 2 to 5 hours at a temperature of about 500° C. in a bath containing potassium nitrate and sodium nitrate at a ratio of about 50:50, but the disclosure is not limited thereto.

The third trend line may be obtained by a secondary ion exchange process performed for about 1 to 3 hours at a temperature in a range of about 380° C. to about 460° C. in a bath containing potassium nitrate and sodium nitrate at a ratio of about 70:30, but the disclosure is not limited thereto.

The second trend line may be obtained by a tertiary ion exchange process performed for about 1 to 2 hours at a temperature in a range of about 380° C. to about 460° C. in a bath containing potassium nitrate and sodium nitrate at a ratio of about 70:30, but the disclosure is not limited thereto.

The first trend line may be obtained by a quaternary ion exchange process performed for about 30 minutes to 1 hour at a temperature of about 300° C. in a bath containing potassium nitrate and sodium nitrate at a ratio of about 98:2, but the disclosure is not limited thereto.

In this manner, the area of the first compressive region CSR1 may be increased. As a result, the area of a tensile region CTR can also be increased. Then, when a crack reaches the tensile region CTR, the destructibility of the glass product 100 can be enhanced. In another alternative embodiment, a scattering layer FM is additionally provided on the glass product 100, as illustrated in FIG. 10, such that the scattering of fragments from a broken glass product 100 may be effectively prevented. In such an embodiment, the scattering layer FM may include films that are well known in the art to which the disclosure pertains.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A glass product comprising:
   a first surface;
   a second surface opposite to the first surface;
   a first compressive region extending from the first surface to a point at a first compression depth from the first surface;
   a second compressive region extending from the second surface to a point at a second compression depth from the second surface; and
   a tensile region disposed between the first and second compression regions,
   wherein
   a stress profile of the first compressive region includes a first trend line between the first surface and a first transition point, a second trend line between the first transition point and a second transition point, and a third trend line between the second transition point and the point at the first compression depth,
   a depth from the first surface to the first transition point is about 10 μm or less,
   a stress at the first transition point is about 200 MPa or greater,
   a depth from the first surface to the second transition point is in a range of about 50 μm to about 80 μm, and
   a stress at the second transition point is in a range of about 40 MPa to about 100 MPa.

2. The glass product of claim 1, wherein
   the first, second, and third trend lines have a first average slope, a second average slope, and a third average slope, respectively, and
   the first, second, and third average slopes are negative.

3. The glass product of claim 2, wherein an absolute value of the first average slope is greater than an absolute value of the second average slope and an absolute value of the third average slope.

4. The glass product of claim 3, wherein the absolute value of the second average slope is greater than the absolute value of the third average slope.

5. The glass product of claim 4, wherein
   a tangent at the first transition point has a first transition point slope, and
   the first transition point slope is negative.

6. The glass product of claim 5, wherein an absolute value of the first transition point slope is in a range of the absolute value of the first average slope to the absolute value of the second average slope.

7. The glass product of claim 6, wherein
   a tangent at the second transition point has a second transition point slope, and
   the second transition point slope is negative.

8. The glass product of claim 7, wherein an absolute value of the second transition point slope is in a range of the absolute value of the second average slope and the absolute value of the third average slope.

9. The glass product of claim 1, wherein
   the first, second, and third trend lines have first tangential slopes, second tangential slopes, and third tangential slopes, respectively, and
   the first tangential slopes, the second tangential slopes, and the third tangential slopes are negative.

10. The glass product of claim 9, wherein
    all of the first tangential slopes of the first trend line are negative,
    all of the second tangential slopes of the second trend line are negative, and
    all of the third tangential slopes of the third trend line are negative.

11. The glass product of claim 1, wherein
    a compressive stress at the first surface is in a range of about 700 Mpa to about 950 Mpa, and
    the first compression depth is in a range of about 125 μm to about 135 μm.

12. The glass product of claim 1, wherein the glass product includes lithium aluminosilicate.

13. The glass product of claim 1, wherein a stress profile of the second compressive region is symmetrical with the stress profile of the first compressive region.

14. A glass product comprising:
a first surface;
a second surface opposite to the first surface;
a first compressive region extending from the first surface to a point at a first compression depth from the first surface;
a second compressive region extending from the second surface to a point at a second compression depth from the second surface; and
a tensile region disposed between the first and second compression regions,
wherein
a stress profile of the first compressive region includes a first trend line between the first surface and a first transition point, a second trend line between the first transition point and a second transition point, and a third trend line between the second transition point and the point at the first compression depth,
the first, second, and third trend lines correspond to first, second, and third functions, respectively, and
the first, second, and third functions are respectively defined as follows: $y=a_1(x-p1)^2+q1$; $y=a_2(x-p2)^2+q2$; and $y=a_3(x-p3)^2+q3$,
wherein $a_1$, $a_2$, and $a_3$ are coefficients and have positive values,
p1, p2, and p3 respectively denote x-axis coordinates of vertexes of the first, second, and third functions, and
q1, q2, and q3 respectively denote y-axis coordinates of the vertexes of the first, second, and third functions.

15. The glass product of claim 14, wherein
the coefficient $a_1$ of the first function is greater than the coefficients $a_2$ and $a_3$ of the second and third functions, and
the coefficient $a_2$ of the second function is greater than the coefficient $a_3$ of the third function.

16. The glass product of claim 15, wherein
the x-axis coordinate p1 of the vertex of the first function is in a range of about 5 μm to about 50 μm,
the x-axis coordinate p2 of the vertex of the second function is in a range of about 50 μm to about 150 μm,
the x-axis coordinate p3 of the vertex of the third function is in a range of about 160 μm to about 250 μm,
the y-axis coordinate q1 of the vertex of the first function is in a range of about 100 MPa to about 300 MPa,
the y-axis coordinate q2 of the vertex of the second function is in a range of about 5 MPa to about 80 MPa, and
the x-axis coordinate q3 of the vertex of the third function is in a range of about −60 MPa to about 0 MPa.

17. The glass product of claim 14, wherein
a depth from the first surface to the first transition point is about 10 μm or less,
a stress at the first transition point is about 200 MPa or greater,
a depth from the first surface to the second transition point is in a range of about 50 μm to about 80 μm, and
a stress at the second transition point is in a range of about 40 MPa to about 100 MPa.

18. The glass product of claim 14, wherein a stress profile of the second compressive region is symmetrical with the stress profile of the first compressive region.

19. A display device comprising:
a display panel including a plurality of pixels;
a cover window disposed above the display panel; and
an optically transparent bonding layer disposed between the display panel and the cover window,
wherein
the cover window includes a first surface, a second surface opposite to the first surface, a first compressive region extending from the first surface to a point at a first compression depth from the first surface, a second compressive region extending from the second surface to a point at a second compression depth from the second surface; and a tensile region disposed between the first and second compression regions,
a stress profile of the first compressive region includes a first trend line between the first surface and a first transition point, a second trend line between the first transition point and a second transition point, and a third trend line between the second transition point and the point at the first compression depth,
a depth from the first surface to the first transition point is about 10 μm or less,
a stress at the first transition point is about 200 MPa or greater,
a depth from the first surface to the second transition point is in a range of about 50 μm to about 80 μm,
a stress at the second transition point is in a range of about 40 MPa to about 100 MPa, and
a stress at a depth of about 30 μm from the first surface is about 100 MPa or greater.

20. The display device of claim 19, wherein
the first, second, and third trend lines have a first average slope, a second average slope, and a third average slope, respectively,
the first, second, and third average slopes are negative, and
an absolute value of the first average slope is greater than an absolute value of the second average slope and an absolute value of the third average slope.

* * * * *